(12) United States Patent  
Lim et al.

(10) Patent No.: US 7,835,167 B2
(45) Date of Patent: Nov. 16, 2010

(54) MAGNETIC DOMAIN DATA STORAGE DEVICES AND METHODS OF OPERATING THE SAME

(75) Inventors: Chee-kheng Lim, Suwon-si (KR); In-kyeong Yoo, Suwon-si (KR); Sung-hoon Choa, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 309 days.

(21) Appl. No.: 11/980,418

(22) Filed: Oct. 31, 2007

(65) Prior Publication Data

US 2008/0138659 A1 Jun. 12, 2008

(30) Foreign Application Priority Data

Dec. 6, 2006 (KR) .................. 10-2006-0123383

(51) Int. Cl.
G11C 19/00 (2006.01)
G11C 11/00 (2006.01)
G11C 11/14 (2006.01)
G11C 11/15 (2006.01)

(52) U.S. Cl. .................. 365/80; 365/87; 365/88; 365/158; 365/171; 365/173

(58) Field of Classification Search .................. 365/80, 365/87, 88, 158, 171, 173
See application file for complete search history.

(56) References Cited

U.S. PATENT DOCUMENTS

| 3,299,413 | A | * | 1/1967 | Snyder | 365/80 |
| 3,369,225 | A | * | 2/1968 | Fuller | 365/80 |
| 7,372,757 | B2 | * | 5/2008 | Shin et al. | 365/80 |
| 7,514,271 | B2 | * | 4/2009 | Gaidis et al. | 365/80 |
| 7,551,469 | B1 | * | 6/2009 | Parkin | 365/80 |
| 2006/0120132 | A1 | | 6/2006 | Parkin | |
| 2008/0137395 | A1 | * | 6/2008 | Hwang et al. | |

OTHER PUBLICATIONS

Korean Office Action (dated Oct. 31, 2007) for counterpart Korean Patent Application No. 10-2006-0123383 is provided for the purposes of certification under 37 C.F.R. §§ 1.97(e).

* cited by examiner

Primary Examiner—Trong Phan
(74) Attorney, Agent, or Firm—Harness, Dickey & Pierce, P.L.C.

(57) ABSTRACT

Example embodiments may provide data storage devices using movement of a magnetic domain wall and/or a method of operating magnetic domain data storage devices. The data storage device may include a first magnetic layer for writing data having two magnetic domains magnetized in different directions, a second magnetic layer for storing data at a side of the first magnetic layer, a data recording device connected to the first magnetic layer and the second magnetic layer, and a plurality of reading heads configured to read the second magnetic layer. The data storage device may store a larger amount of data without requiring moving mechanical systems.

14 Claims, 9 Drawing Sheets

MAGNETIC DOMAIN DATA STORAGE DEVICES AND METHODS OF OPERATING THE SAME

PRIORITY STATEMENT

This application claims benefit under 35 U.S.C. §119 to Korean Patent Application No. 10-2006-0123383, filed on Dec. 6, 2006 in the Korean Intellectual Property Office, the entire disclosure of which is incorporated by reference.

BACKGROUND

1. Field

Example embodiments may relate to a semiconductor device, for example, to data storage devices using movement of a magnetic domain wall and methods of operating example embodiment devices.

2. Description of the Related Art

A general hard disk drive (HDD) is a device that may read and/or write information by rotating a magnetic recording medium in disk form and/or moving a reading/writing head above a magnetic recording medium. HDDs are non-volatile data storage devices that may be capable of storing 100 gigabytes (GB) of data or more and may be used as a storage device in computers.

A HDD may include moving mechanical systems. These mechanical systems may cause various mechanic faults if the HDD is moved or shocked, thereby decreasing mobility and/or reliability of the HDD. These mechanical systems may increase manufacturing complexity and/or costs of the HDD, increase power consumption, and/or generate noise. If HDDs are reduced in size, these problems associated with manufacturing complexity and cost may increase.

Data storage devices using magnetic domain manipulation may require fewer moving mechanical systems and may prevent or reduce problems associated with moving mechanical systems.

Magnetic regions that make up a magnetic body may be called magnetic domains. A single magnetic domain has identical direction of magnetic moment. Size and magnetization direction of magnetic domains may depend on the property, shape, size of a magnetic material and on external energy.

A magnetic domain wall may be a boundary between magnetic domains having different magnetization directions and may be moved by a current and/or a magnetic field applied to a magnetic material. A plurality of magnetic domains having one magnetization direction may be formed in a magnetic layer of a desired width and thickness, and magnetic domains and magnetic domain walls may be moved using a current and/or magnetic field.

Applying the principle of moving magnetic domain walls to information storage devices, magnetic domains may be passed through pinned reading/writing heads by movement of a magnetic domain wall, thereby enabling reading/writing without rotation of recording medium.

A related art data storage device using the moving principle of a magnetic domain wall according to the conventional art may include a U-shaped magnetic layer. The magnetic layer may be formed in a storage region having a plurality of magnetic domains and/or a buffer region, the length of which may be similar to that of the storage region. A reading head and/or a writing head may be formed under a middle portion of the magnetic layer. A current may be applied to the magnetic layer to pull and/or push the magnetic domain wall to perform reading and/or writing operations.

Related art storage devices may require a buffer region as large as that of a storage region, and the actual storage capacity of related art storage devices may be about half of the capacity of the physical storage region. Because it may be difficult to create a U-shaped magnetic layer using related art etching processes, it may be difficult to use related art storage devices. A writing head using an external magnetic field may not be successfully applied to a ferromagnetic layer having high magnetic anisotropic energy, and so magnetic layers of related art storage devices may be formed of a soft magnetic material. It may be difficult to stabilize movement of magnetic domain walls if the magnetic layer is formed of a soft magnetic material compared to a magnetic layer formed of a ferromagnetic material.

SUMMARY

Example embodiments may provide data storage devices using magnetic domain wall movement and may have higher valid storage capacity and simpler operation.

Example embodiments may also provide methods of operating a data storage device.

Example embodiments may provide a data storage device including a first magnetic layer for writing data having two magnetic domains magnetized in different directions, a second magnetic layer for storing data at a side of the first magnetic layer, a data recording device connected to the first and second magnetic layer, and a plurality of reading heads configured to read the second magnetic layer.

The first magnetic layer may be linear and/or arc-shaped.

The second magnetic layer may be linear and/or in an incomplete ring shape.

The first magnetic layer may be linear and the second magnetic layer may be of an incomplete ring shape. A plurality of the second magnetic layers may be at a side of each of the first magnetic layers. The first and second magnetic layers may be on a disk substrate, and the first magnetic layers may have different sizes and may be parallel to and separated from one another, and inner diameters of the second magnetic layers may increase with proximity to an outer edge of the disk substrate.

The first magnetic layer may be arc-shaped and the second magnetic layers may be linear. A plurality of the second magnetic layers may be at a side of each of the first magnetic layers. The first and second magnetic layers may be on a disk substrate, and the first magnetic layers may be on the outer edge of the disk substrate and/or the second magnetic layers may be parallel to and separated from one another between the first magnetic layers.

The data recording device may be connected to both ends of the first magnetic layer and/or to an end of the second magnetic layer not adjacent to the first magnetic layer.

A plurality of the second magnetic layers may be arranged at equivalent intervals.

The first and second magnetic layers may include the same material.

The reading head may be structured so that a first electrode, second magnetic layer, separation layer, pinned layer, antiferromagnetic layer, and/or second electrode are stacked.

The separation layer may be an insulating layer and/or a conductive layer.

A resistive material layer with a greater specific resistance than the second magnetic layer may be between the first electrode and the second magnetic layer and/or between the second magnetic layer and the separation layer.

Example embodiments may provide a method of operating a data storage device having a first magnetic layer for writing data with two magnetic domains magnetized in different directions, a second magnetic layer for storing data at a side of the first magnetic layer, a data recording device connected to the first magnetic layer and/or second magnetic layer, and a plurality of reading heads configured to read the second magnetic layer. Example methods may include a first operation of moving one of two magnetic domains to a portion of the first magnetic layer adjacent to a second magnetic layer and/or a second operation of moving a magnetic domain in a portion of a first magnetic layer adjacent to a second magnetic layer by one bit to a second magnetic layer.

The first operation may be performed by applying a current between both ends of the first magnetic layer and the second operation may be performed by applying a current to the first magnetic layer from the second magnetic layer.

Example methods may include a first operation of reading data recorded on a second magnetic layer using at least one of the reading heads, and/or a second operation of moving a magnetic domain wall of a second magnetic layer from a second end of the second magnetic layer to a first end of the second magnetic layer using the data recording device by one bit.

The first and second operations may be performed alternately until the magnetic domain wall of the second magnetic layer is moved between the reading heads.

Example methods may include applying a current between any two of the reading heads to erase data recorded on the second magnetic layer between the two reading heads.

BRIEF DESCRIPTION OF THE DRAWINGS

The above and/or other features and advantages of example embodiments will become more apparent by describing in detail the attached drawings in which.

DETAILED DESCRIPTION

Various example embodiments will now be described more fully with reference to the accompanying drawings in which some example embodiments are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments. This invention may, however, may be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
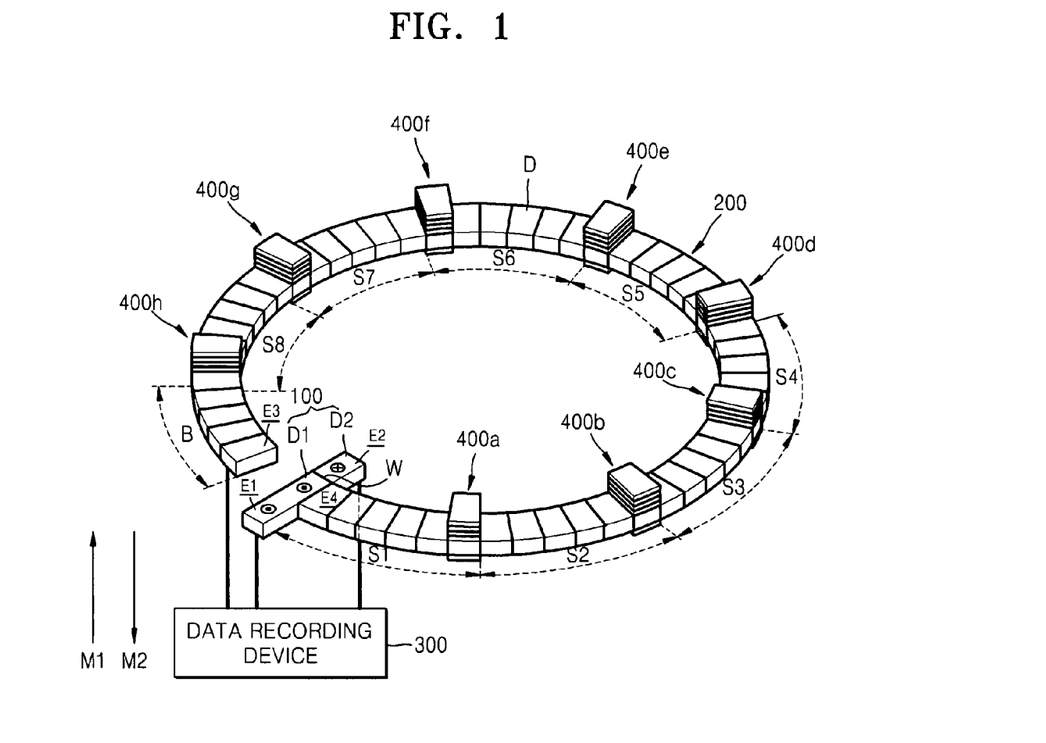
FIG. 1 is a plan view illustrating an example embodiment data storage device using magnetic domain wall movement.

FIG. 1 is a plan view illustrating an example embodiment data storage device that may use magnetic domain walls movement.

As shown in FIG. 1, the example embodiment storage device may include a first magnetic layer 100 for storing data and/or a second magnetic layer 200 formed adjacent to the magnetic layer 100. The first magnetic layer 100 may include two magnetic domains, D1 and D2, magnetized in different directions. The second magnetic layer 200 may include a plurality of magnetic domains D in which data may be recorded. In FIG. 1, the first magnetic layer 100 may be linear and the second magnetic layer 200 may be in an incomplete ring shape, but other shapes may be used. For example, the first magnetic layer 100 may be arc-shaped and/or the second magnetic layer 200 may be linear.

Throughout the drawings, ⊙ means that the magnetic domain is magnetized in a first direction M1, and ⊗ means that the magnetic domain is magnetized in a second direction M2.

A data recording device 300 may be connected to both first and second ends E1 and E2 of the first magnetic layer 100 and a first end E3 of the second magnetic layer 200. The second magnetic layer 200 may have two ends, and the first end E3 of the second magnetic layer 200 may not contact the first magnetic layer 100. The data recording device 300 may be a current controller and/or a voltage controller and may include a plurality of transistors. For example, the data recording device 300 may include a first transistor and a second transistor between first and second ends E1 and E2 of the first magnetic layer 100 and a third transistor between a middle point of the first and second transistors and the first end E3 of the second magnetic layer 200. The direction of a current in the first and second magnetic layers 100 and 200 may be controlled by switching the first through third transistors on/off. A magnetic domain wall W, which may be a boundary between the first and second magnetic domains D1 and D2, may be moved by controlling the direction of the current.

A plurality of reading heads 400 may be along the second magnetic layer 200 at equal intervals. For example, as shown in FIG. 1, eight reading heads 400a through 400h may be along the second magnetic layer 200. The reading heads 400 may be tunnel magnetoresistive (TMR) heads, giant magenetoresistive (GMR) heads, and/or another suitable head type described later. The second magnetic layer 200 may be divided into sectors between the reading heads 400. A section of the second layer 200 between the reading head 400h and the first end E3 may be a buffer region B. Reference numerals S1 through S8 illustrate sectors in FIG. 1. The size of the buffer region B may have the same as the size of one of sectors S1 through S8. If the second magnetic layer 200 is divided N sections by the reading heads 400, the size of the buffer region B may be one Nth of the second magnetic layer 200. A buffer region in a related art storage device may consume about one-half the physical storage capacity of the magnetic layer, but the buffer region B of the example embodiment storage device may be smaller than one-half of the magnetic layer. If the number of the reading heads 400 is increased, the size of the buffer region B may be further reduced. Data of the eight sectors S1 through S8 may be read if magnetic domain walls of the second magnetic layer 200 are moved between neighboring reading heads 400, that is, by a length of one sector during reading. Example embodiment storage devices may have greater recording density than related art storage devices.

An example writing operation of a magnetic domain storage device will be described in detail with reference to FIGS. 2A through 2D.

FIGS. 2A through 2D are plan views illustrating example methods of operating magnetic domain data storage devices, for example, the example embodiment storage device of FIG. 1.

Figure 2A:
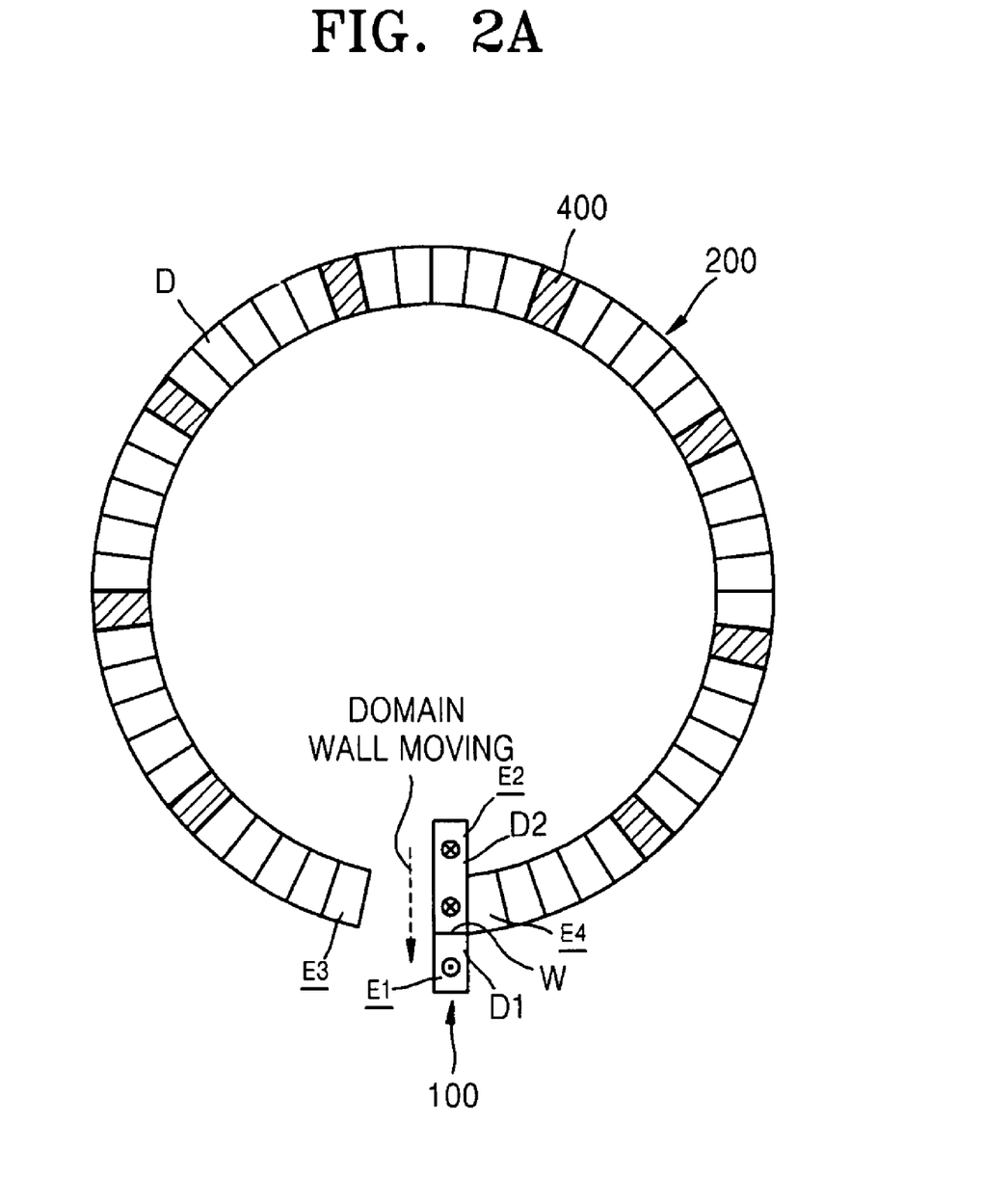
FIGS. 2A through 2D are plan views illustrating an example method of operating data storage devices.

As shown in FIG. 2A, a current may be applied from the first end E1 to the second end E2 of the first magnetic layer 100 of the example embodiment storage device to move the magnetic domain wall W from the second end E2 to the first end E1 of the first magnetic layer 100. The second magnetic domain D2 may extend to the portion of the first magnetic layer 100 adjacent to the second magnetic layer 200.

Figure 2B:
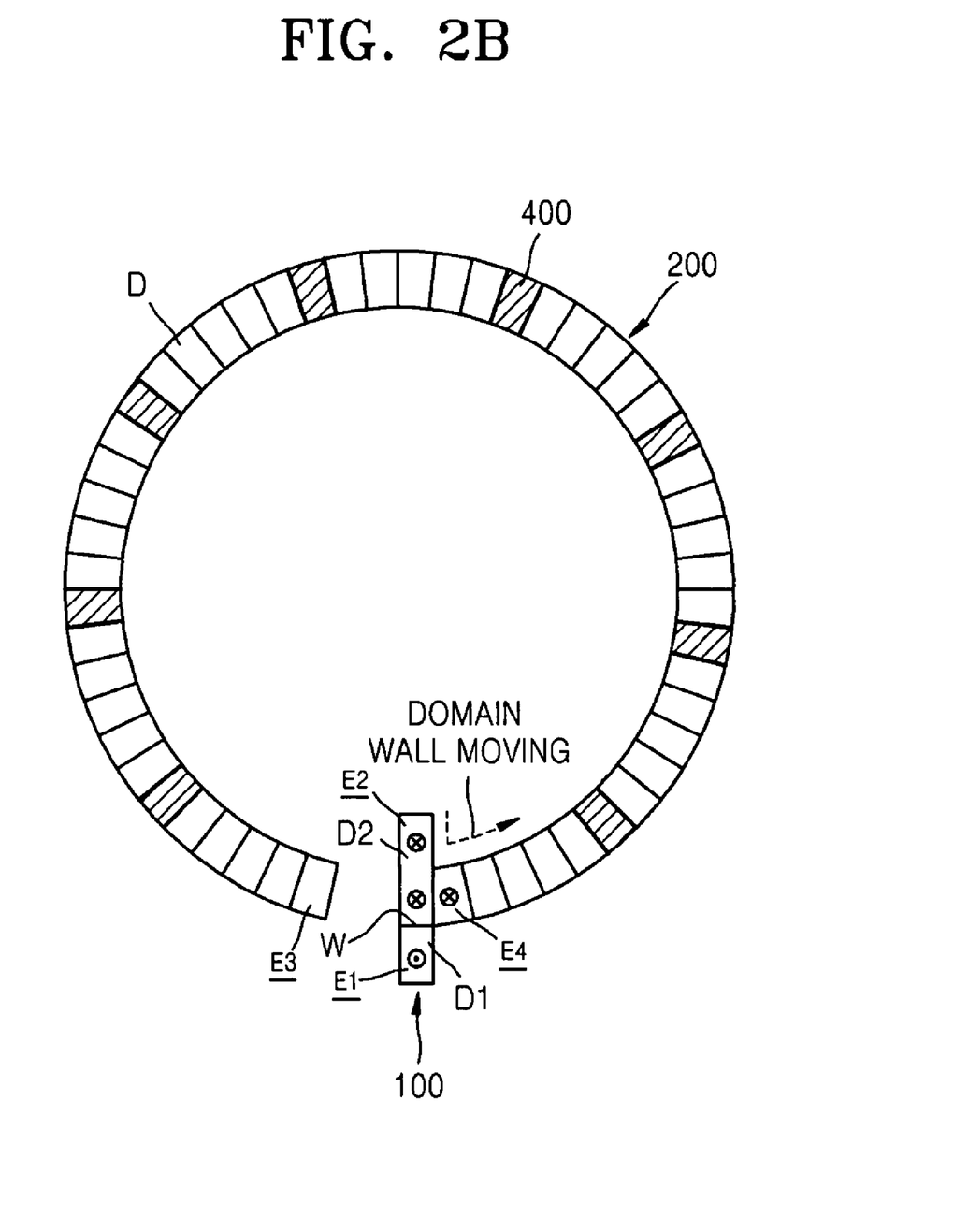

As shown in FIG. 2B, a pulse current may be applied from the first end E3 of the second magnetic layer 200 to the second end E2 of the first magnetic layer 100 to transfer a magnetic domain in the first magnetic layer 100 adjacent to the second magnetic layer 200 to a second end E4 of the second magnetic layer 200. Data corresponding to the second magnetic domain D2 of the first magnetic layer 100, for example, data corresponding to '1,' may be recorded to the second end E4 of the second magnetic layer 200.

Figure 2C:
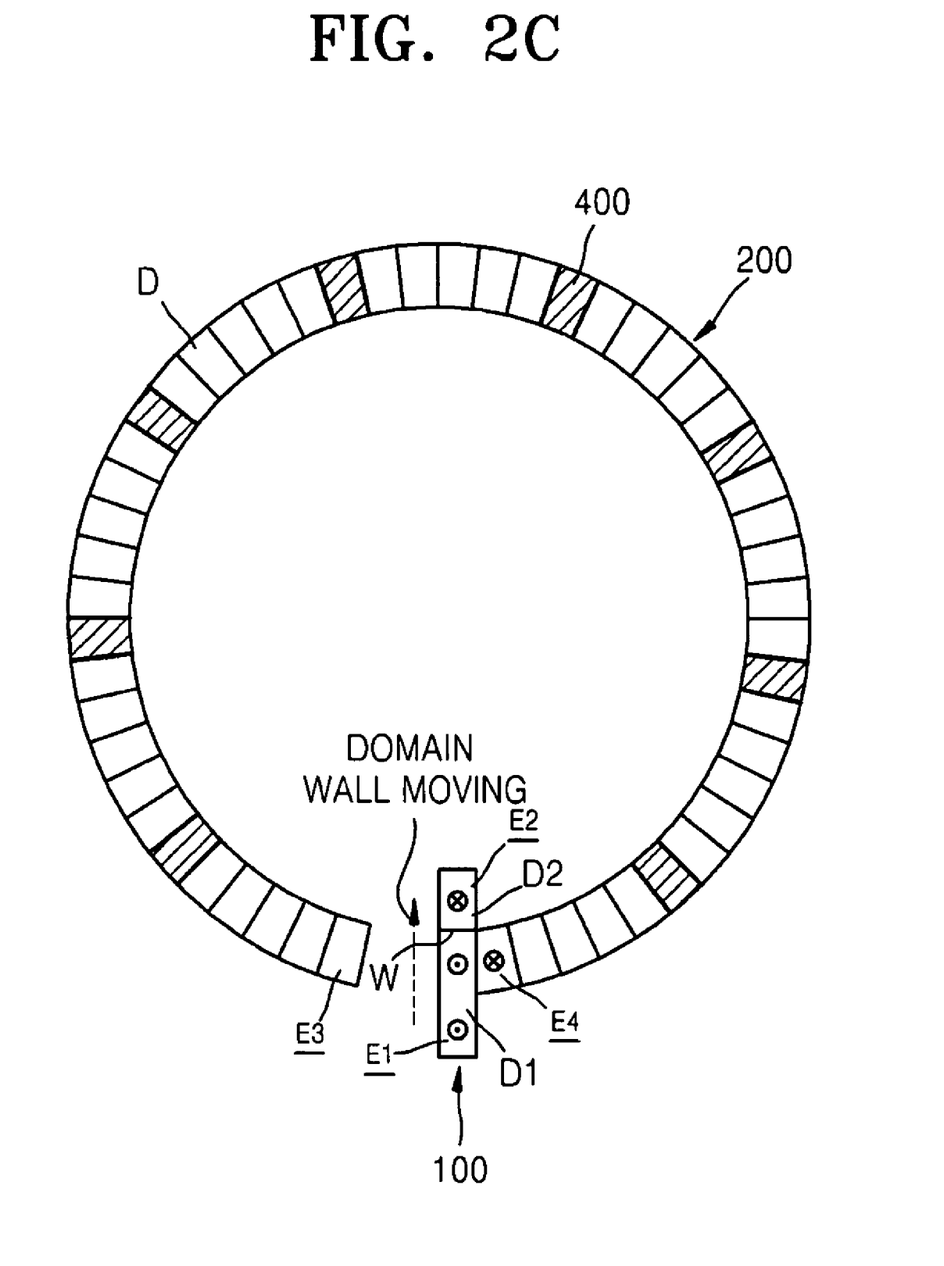

As shown in FIG. 2C, a current may be applied from the second end E2 to the first end E1 of the first magnetic layer 100 to move the magnetic domain W from the first end E1 to the second end E2 of the first magnetic layer 100. The first magnetic domain D1 may extend to the portion of the first magnetic layer 100 adjacent to the second magnetic layer 200.

Figure 2D:
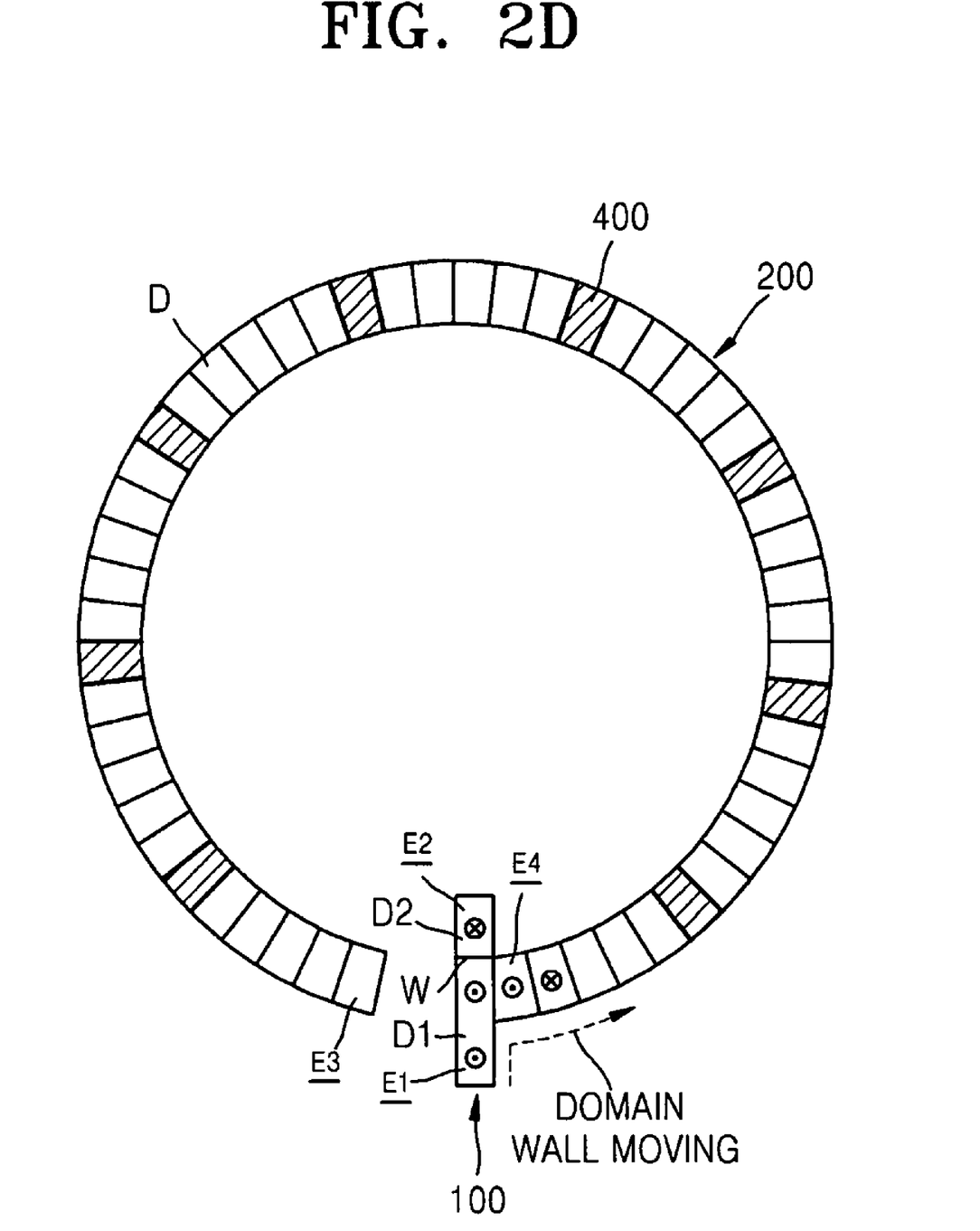

As shown in FIG. 2D, a pulse current may be applied from the first end E3 of the second magnetic layer 200 to the first end E1 of the first magnetic layer 100 to transfer a magnetic domain in the first magnetic layer 100 adjacent to the second magnetic layer 200 to the second end E4 of the second magnetic layer 200. Data corresponding to the first magnetic domain D1 of the first magnetic layer 100, for example, data corresponding to '0,' may be recorded to the second end E4 of the second magnetic layer 200. By these operations, data may be recorded in a storage region of the second magnetic layer 200.

Data may be recorded by moving magnetic domain walls in the second magnetic layer 200 and the first magnetic layer 100 next to the second magnetic layer 200. Writing using movement of the magnetic domain walls may be performed in a single plane by controlling the flow of a current. Example writing operations may be independent of physical properties and/or dimensions of a magnetic layer to which data may be recorded; thus the second magnetic layer 200 to which data may be recorded may be formed of a ferromagnetic material. Example embodiment devices using magnetic domain wall moving by example methods may have greater stability than related art storage device. Example embodiment storage devices may have higher recording density than related art storage devices.

Reading heads 400 included in example embodiment storage devices will now be described in detail.

Figure 3:
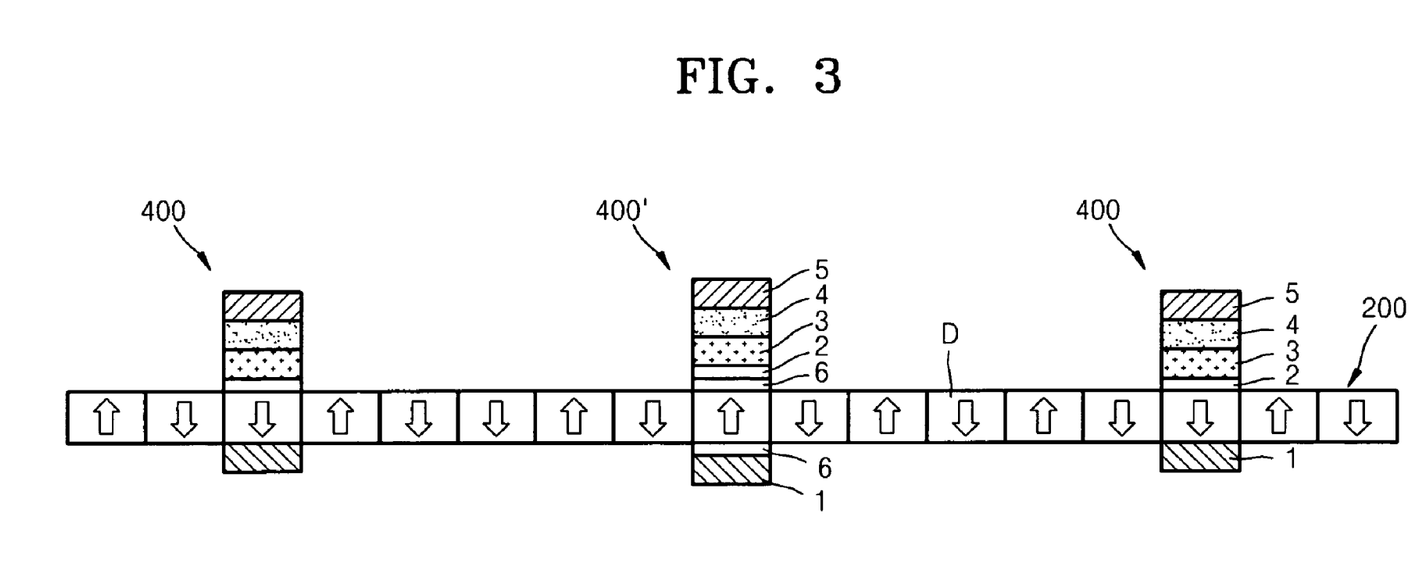
FIG. 3 is a cross-sectional view illustrating a portion of a second magnetic layer and a reading head of the example embodiment data storage device of FIG. 1.

FIG. 3 is a cross-sectional view illustrating a portion of the second magnetic layer 200 and a reading head 400 of FIG. 1. The second magnetic layer 200 is illustrated as linear in this example embodiment. Arrows in magnetic domains D indicate the magnetization direction of each magnetic domain D and denote that data is recorded in the second magnetic layer 200.

As shown in FIG. 3, the reading head 400 has a structure having a first electrode 1, second magnetic layer 200, separation layer 2, pinned layer 3, antiferromagnetic layer 4, and/or second electrode 5 in a stack. Width of the separation layer 2, pinned layer 3, and antiferromagnetic layer 4 may be substantially the same as that of the magnetic domain D; width of the first and second electrodes 1 and 5 need not correspond to the width of the magnetic domain D. For example, the first electrode 1 may be continuous over the whole lower surface of the second magnetic layer 200. The second electrode 5 may be formed in wires perpendicularly crossing the second magnetic layer 200. A second conductive layer and/or second pinned layer (not shown) may be further formed between the pinned layer 3 and the antiferromagnetic layer 4. The pinned layer 3 and/or second pinned layer may be magnetized in different directions.

The separation layer 2 may be an insulating layer and/or a conductive layer. If the separation layer 2 is an insulating layer, the reading head 400 may be a TMR head. If the separation layer 2 is a conductive layer, the reading head 400 may be a GMR head.

The resistance between the first electrode 1 and the second electrode 5 may vary due to the direction of the magnetization of the magnetic domain D of the second magnetic layer 200 in the reading head 400. Data recorded in the magnetic domain D may be read by detecting the resistance variation.

Alternatively, a resistance material layer 6 with a greater specific resistance than the second magnetic layer 200, for example, an insulating layer, may be between the first electrode 1 and the second magnetic layer 200 and/or between the second magnetic layer 200 and the separation layer 2 in the reading head 400'. The resistance material layer may block leakage of a current applied to the second magnetic layer 200 to the reading head 400'

Because a plurality of the reading heads 400 may be formed in example embodiment storage devices, data may be read selectively. For example, in FIG. 1, if the magnetic domain walls of the second magnetic layer 200 are moved in the direction of a first end E3 bit by bit and simultaneously a head, for example, the second reading head 400b, is operated, data recorded in the second sector S2 can be read. After performing a reading operation, the magnetic domain walls of the second magnetic layer 200 may be moved in the direction of the second end E4 of the second magnetic layer 200 to restore the position of the data. In example embodiment data storage devices, magnetic domain walls of the second magnetic layer 200 may be moved to operate at least two reading heads 400, and thus data recorded on at least two sectors may be read simultaneously. Data read simultaneously may be combined by an additional channel chip (not shown) connected to the reading heads 400. Because selective reading and/or simultaneous reading may be possible, the data access time may be reduced. In addition, data may be selectively erased. For example, a current may be applied between the second reading head 400b and the third reading head 400c in FIG. 1 to move the magnetic domain walls in the third sector S3 and erase data recorded on the third sector S3.

An example embodiment device highly integrated on a disk substrate will now be described.

Figure 4:
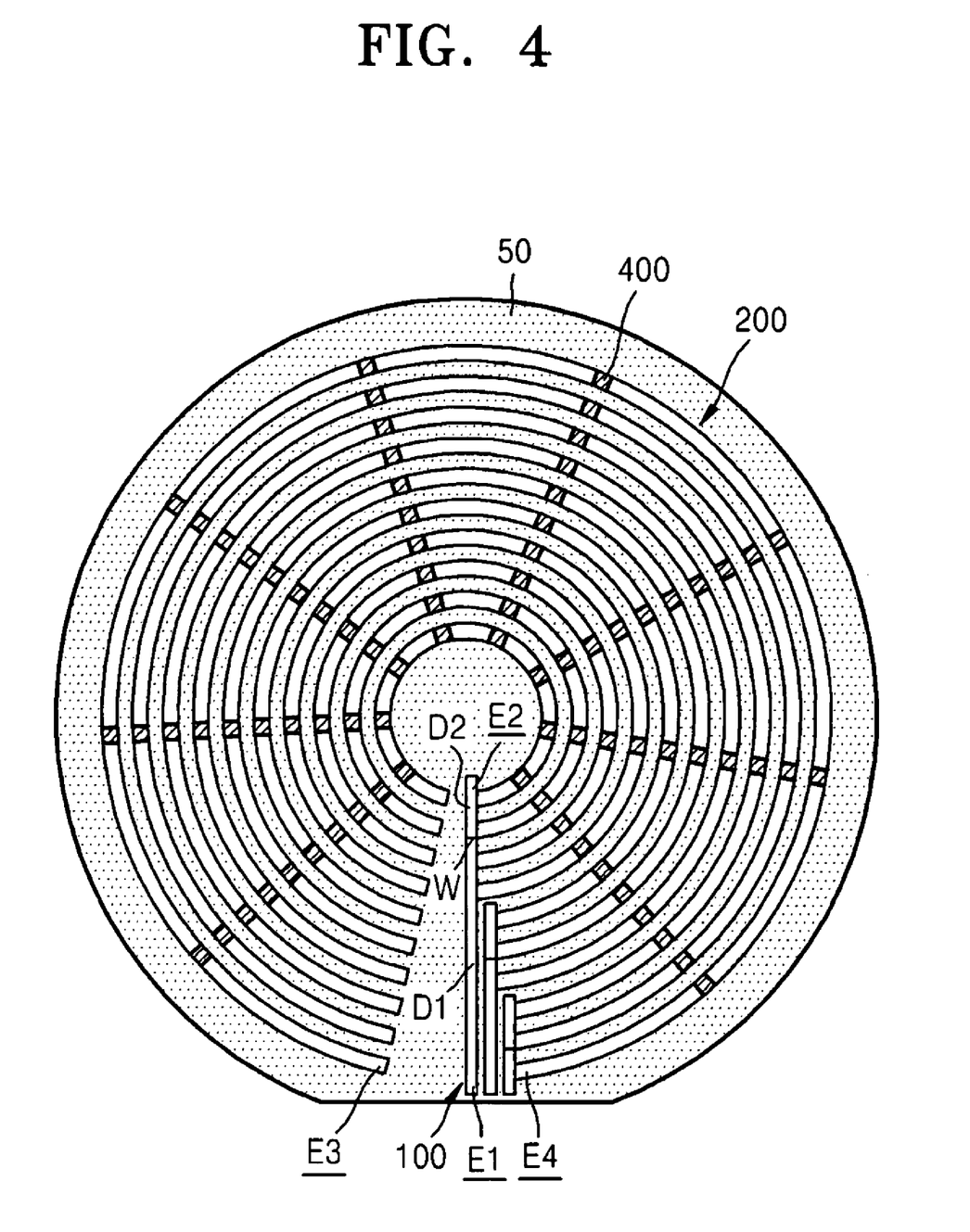
FIGS. 4 through 6 are plan views illustrating example embodiment data storage devices using movement of magnetic domain walls.
Figure 5:
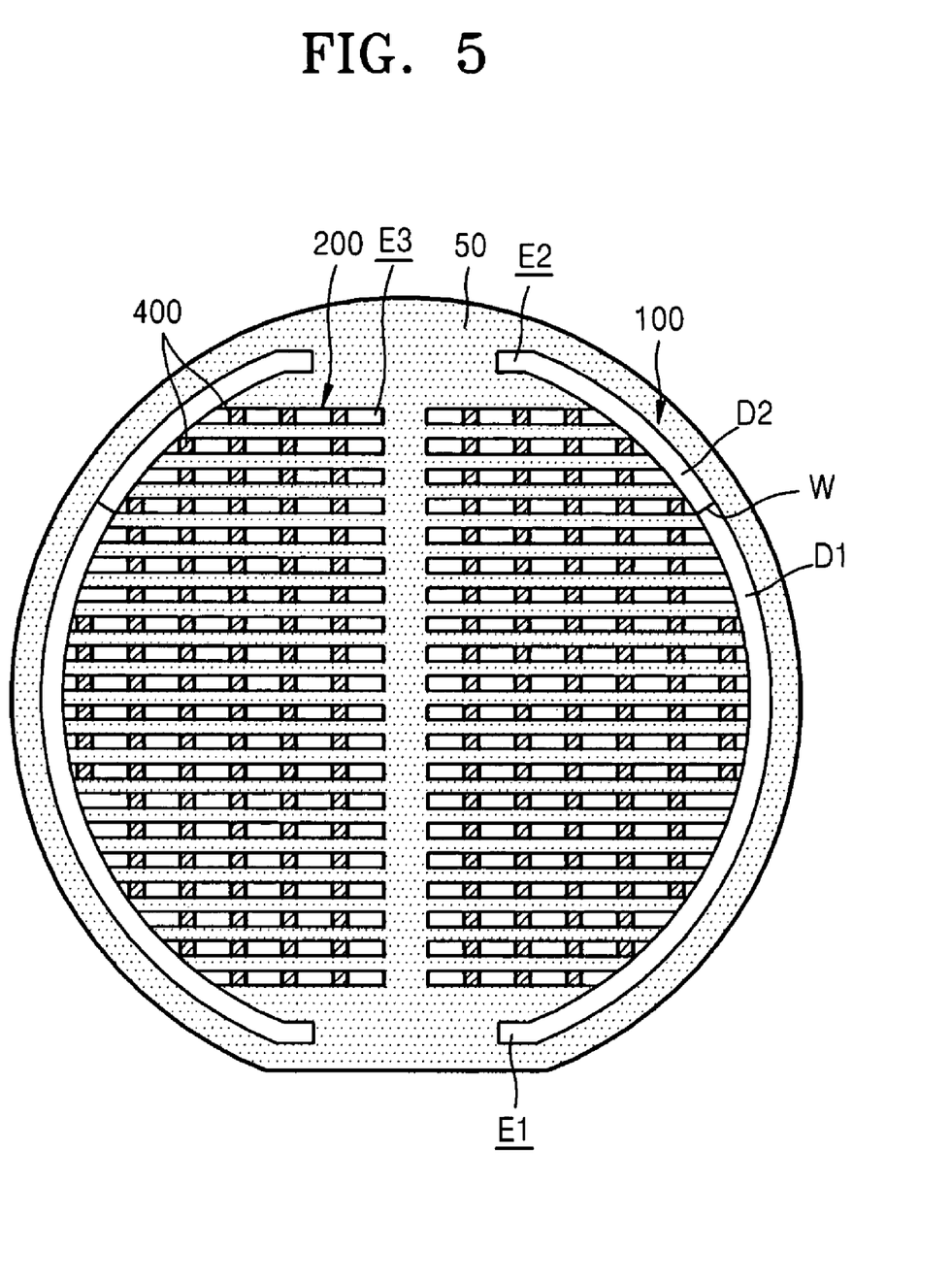
Figure 6:
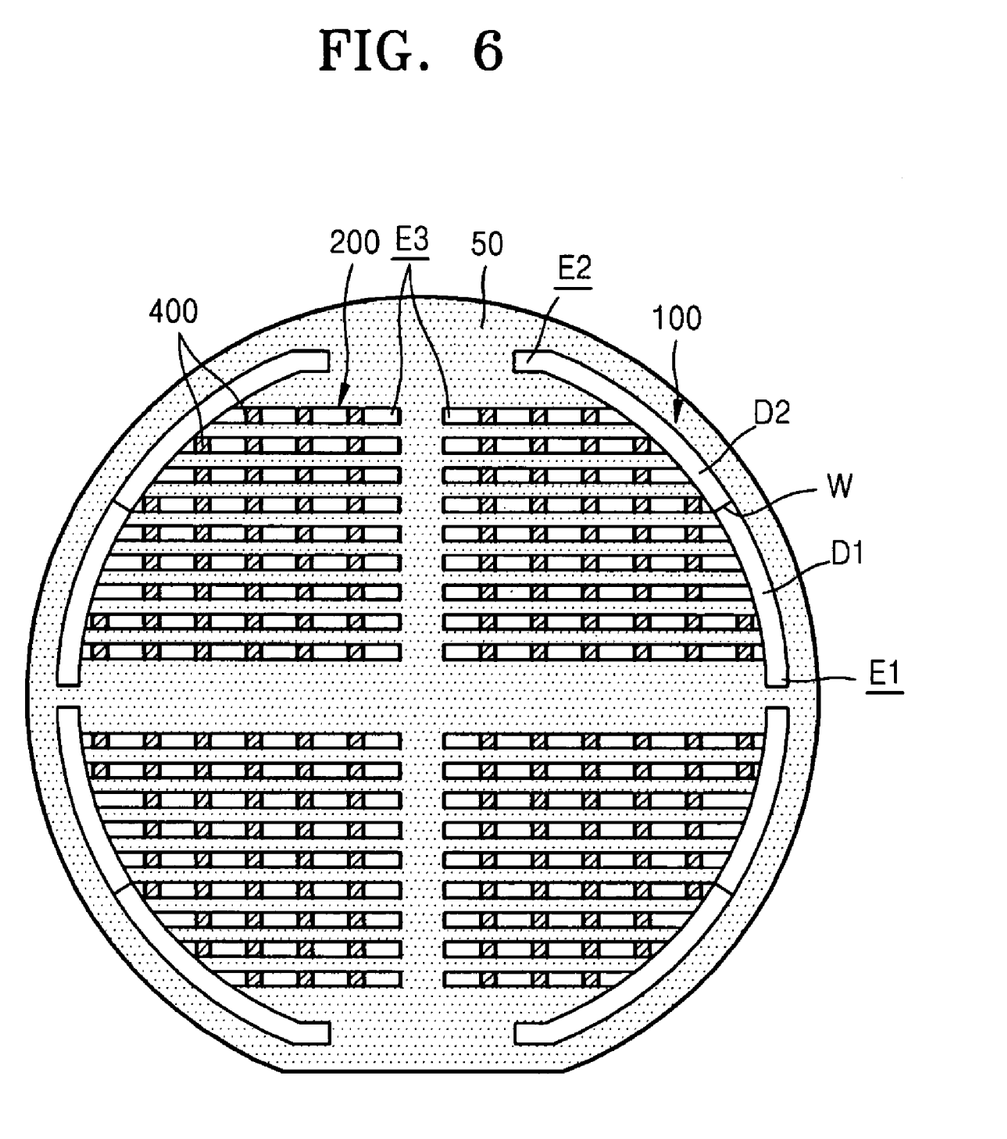

FIGS. 4 through 6 are plan views illustrating three example embodiment data storage devices using movement of magnetic domain walls.

As shown in FIG. 4, a first magnetic layer 100 for writing data may be in a region of a disk substrate 50. The disk substrate 50 may be divided into four sections by a cross line (not shown). There may be a plurality of first magnetic layers 100 in different sizes on the disk substrate 50. For example, the length of the first magnetic layers 100 may decrease with increased distance from the center of the disk substrate 50. The quantity and/or size of the first magnetic layers 100 may vary.

A plurality of magnetic layers 200 may be at a side of each of the first magnetic layers 100. The second magnetic layers 200 may be incomplete rings arranged at radial intervals. Inner diameters of the second magnetic layers 200 may decrease as the second magnetic layers are closer to a center of the disk substrate 50. The second magnetic layers 200 may be discrete data storage regions.

A plurality of reading heads 400 are formed at equivalent intervals along the second magnetic layers 200. The reading heads 200 are connected to detectors (not shown) including an amplifier such as a sense amplifier and the detectors may be connected to a predetermined channel chip (not shown) for data combining.

First and second contact plugs (not shown) may be under and/or on both ends E1 and E2 of each of the first magnetic layers 100 for electric contact with a data recording device (shown in FIG. 1). A third contact plug (not shown) may be formed under and/or on a first end E3 of the second magnetic layer 200 for electric contact with the data recording device. A substantially similar arrangement may be present in other example embodiments of data storage devices using the magnetic domain wall described below with reference to FIGS. 5 and 6.

The shape of the first and/or second magnetic layers 100 and 200 in the example embodiment storage device shown in FIG. 4 can be modified in various ways. Additional example embodiments of some of these potential modifications are illustrated in FIGS. 5 and 6.

FIG. 5 is a plan view illustrating a second example embodiment data storage device using movement of a magnetic domain wall.

As shown in FIG. 5, two first magnetic layers 100 in arc shapes may be on the outer edge of a substrate 50. A plurality of linear second magnetic layers 200 may extend to the middle portion of the substrate 50 from a side of each arc portion of the first magnetic layers 100. A plurality of reading heads 400 may be spaced at equal intervals along each of the second magnetic layers 200.

FIG. 6 is a plan view illustrating a third example embodiment data storage device. The third storage device may vary from the second example embodiment storage device in the number of the first magnetic layers 100.

As shown in FIG. 6, four first magnetic layers 100 in arc shapes may be on the outer edge of a substrate 50. A plurality of linear second magnetic layers 200 may extend from a side of each arc portion of the first magnetic layers 100 to the middle portion of the substrate 50. A plurality of reading heads 400 may be spaced at equal intervals along each of the second magnetic layers 200.

As the first and second magnetic layers 100 and 200 may be more integrated on the substrate 50, example embodiment storage devices may be capable of storing larger amounts of data. Example embodiment storage devices may not require moving mechanical systems and may not be affected by faults in the mechanical systems. Example embodiment storage devices may store larger amounts of data and have better mobility and/or reliability. Example embodiment storage devices may not require mechanical systems and may be easier to manufacture, consumes less power, and require less manufacturing costs.

In example embodiment data storage devices illustrated in FIGS. 4 through 6, each of the first magnetic layers 100 may be a common writing device for recording data to second magnetic layers 200. A current may be applied to a first end E1 and/or a second end E2 of the first magnetic layer 100 to transfer a magnetic domain wall W to a desired position, thereby recording data to a second magnetic layer. First and second magnetic layers 100 and 200 may share the same plane and/or the first magnetic layer 100 may be used as a common writing device. A manufacturing process of example embodiment devices may be easier than the related art devices.

The first magnetic layer 100 will now be described in more detail.

In example embodiments, the first magnetic layer 100 may be simple, as has been described. To form first and second magnetic domains D1 and D2 in the first magnetic layer 100, structure and/or components of the first magnetic layer 100 may require modification and diversification. For example, at least one of a first end E1 and/or a second end E2 of the first magnetic layer 100 may have a larger width than the rest of the region except the first end E1 and the second end E2, and/or the first end E1 and/or the second end E2 may be formed to have increasing width with distance from the center of the first magnetic layer 100. The first end E1 and/or the second end E2 may have different sizes. An antiferromagnetic layer may be on the first end E1. First and second antiferromagnetic layers having different Neel temperatures may be on the first end E1 and/or the second end E2. Alternatively, a non-magnetic layer, an antiferromagnetic pinned layer, and/or a first antiferromagnetic layer may be stacked on the first end E1 and a second antiferromagnetic layer may be on the second end E2. If an external magnetic field is applied to the first magnetic layer 100 after modifying the structure of the first magnetic layer 100 and/or diversifying the components of the first magnetic layer 100, a first magnetic domain D1 and a second magnetic domain D2 may be formed, and destruction of the magnetic domains D1 and D2 can be prevented. For example, if the first and/or second ends E1 and E2 have a larger width than the rest of the region, current density in the ends E1 and E2 may be reduced. Thus, if a magnetic domain wall is moved from the first end E1 to the second end E2 or vice versa, the magnetic domain wall may not extend into the second or first end E2 or E1, and the first and/or second magnetic domains D1 and D2 may not disappear.

Example embodiment data storage devices capable of storing larger amounts of data may be operated without mechanical systems. Example embodiment storage devices may have improved mobility and/or reliability and may be more easily manufactured and consume less power.

Because a plurality of reading heads may be included in example embodiment storage devices, size of a buffer region may be reduced compared to the related art devices. For example, more than 90% of a second magnetic layer may be usable as a storage region. Example embodiment storage devices may have a higher recording density than related art storage devices. Reading heads in example embodiments may enable selective reading, simultaneous reading, and/or selective erasing, and data access time may be reduced. Because data may be recorded by moving the magnetic domain wall in the first and second magnetic layers in example embodiment storage devices, the second magnetic layer for storing data may be formed of a ferromagnetic material. Thus stability of magnetic domain wall movement may be improved, and recording density may be increased.

While example embodiments have been shown and described with reference to figures attached, the exemplary embodiments should be considered in descriptive sense only and not for purposes of limitation. For example, it will be understood by those skilled in the art that various changes in form and details of the data storage device of the present invention may be made. Also, the above-described embodiments are related to first and second magnetic layers having vertical magnetic anisotropy; however, example embodiments may be applied to first and second magnetic layers having horizontal magnetic anisotropy. Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A data storage device, comprising:
a first magnetic layer including at least two magnetic domains magnetized in different directions to each other;
a second magnetic layer having a first end adjacent to the first magnetic layer;
a data recording device electrically connected to the first magnetic layer and the second magnetic layer; and
a plurality of reading heads configured to read data stored in the second magnetic layer.

2. The data storage device of claim 1, wherein
the first magnetic layer is linear or arc-shaped, and
the second magnetic layer is linear or in an incomplete ring shape.

3. The data storage device of claim 2, wherein the first magnetic layer is linear and the second magnetic layer is in an incomplete ring shape.

4. The data storage device of claim 3, further comprising:
a plurality of the first magnetic layers; and
a plurality of the second magnetic layers.

5. The data storage device of claim 4, wherein
each of the first and each of the second magnetic layers are on a disk substrate,
each of the first magnetic layers have a unique length and are parallel and spaced at equal intervals to each other, and
each of the second magnetic layers are concentric, are spaced at equal radial intervals, and extend through a same angular displacement on the disk substrate.

6. The data storage device of claim 2, wherein the first magnetic layer is arc-shaped and the second magnetic layer is linear.

7. The data storage device of claim 6, further comprising:
a plurality of the first magnetic layers; and
a plurality of the second magnetic layers.

8. The data storage device of claim 7, wherein
each of the first and second magnetic layers are on a disk substrate,
each of the first magnetic layers on an outer edge of the disk substrate, and
each of the second magnetic layers are parallel to each other and between the plurality of first magnetic layers.

9. The data storage device of claim 1, wherein the data recording device is connected to a first end and a second end of the first magnetic layer and to a second end of the second magnetic layer, the second end of the second magnetic layer being not adjacent to the first magnetic layer.

10. The data storage device of claim 1, further comprising:
a plurality of the second magnetic layers, each of the second magnetic layers being spaces at equal intervals.

11. The data storage device of claim 1, wherein the first and the second magnetic layers are formed of a same material.

12. The data storage device of claim 1, wherein each reading head includes a first electrode, a portion of the second magnetic layer, a separation layer, a pinned layer, an antiferromagnetic layer, and a second electrode.

13. The data storage device of claim 12, wherein the separation layer is an insulating layer or a conductive layer.

14. The data storage device of claim 12, wherein each reading head includes a resistive material layer having a greater specific resistance than the second magnetic layer between at least one of the first electrode and the portion of the second magnetic layer and the portion of the second magnetic layer and the separation layer.

* * * * *